US006717451B1

(12) United States Patent
Klein et al.

(10) Patent No.: US 6,717,451 B1
(45) Date of Patent: Apr. 6, 2004

(54) PRECISION ANALOG LEVEL SHIFTER WITH PROGRAMMABLE OPTIONS

(75) Inventors: Hans W. Klein, San Jose, CA (US); Paul Hildebrant, Banks, OR (US); Joey Doernberg, San Jose, CA (US); Jian Li, Portland, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 106 days.

(21) Appl. No.: 10/159,089

(22) Filed: May 30, 2002

Related U.S. Application Data

(60) Provisional application No. 60/295,256, filed on Jun. 1, 2001.

(51) Int. Cl.[7] .................................................. H03L 5/00
(52) U.S. Cl. ........................................ 327/333; 326/80
(58) Field of Search .......................... 327/333; 326/80, 326/81, 62, 63, 68

(56) References Cited

U.S. PATENT DOCUMENTS

| | | | |
|---|---|---|---|
| 4,250,556 A | 2/1981 | Goser ............................ 708/1 |
| 4,698,800 A | 10/1987 | Cavaliere et al. ........... 327/103 |
| 5,068,823 A | 11/1991 | Robinson ..................... 716/16 |
| 5,107,146 A | 4/1992 | El-Ayat ........................ 326/41 |
| 5,196,740 A | 3/1993 | Austin ......................... 327/566 |
| 5,285,168 A | * | 2/1994 | Tomatsu et al. ............. 330/253 |
| 5,311,142 A | 5/1994 | Terane et al. ................. 330/10 |
| 5,416,484 A | 5/1995 | Lofstrom .................... 341/159 |
| 5,463,349 A | 10/1995 | Petersen et al. ............. 330/254 |
| 5,467,313 A | * | 11/1995 | Jung et al. .............. 365/189.11 |
| 5,510,738 A | 4/1996 | Gorecki et al. ............. 327/103 |
| 5,528,179 A | 6/1996 | Siniscalchi et al. ......... 327/103 |
| 5,554,957 A | 9/1996 | Klein ........................... 330/251 |
| 5,557,234 A | 9/1996 | Collins ........................ 327/363 |
| 5,574,678 A | 11/1996 | Gorecki ....................... 708/801 |
| 5,606,272 A | * | 2/1997 | Behbahani et al. ........... 327/65 |
| 5,631,606 A | 5/1997 | Tran ............................. 330/253 |
| 5,680,070 A | 10/1997 | Anderson et al. ........... 327/336 |
| 5,821,776 A | 10/1998 | McGowan .................... 326/41 |
| 5,877,536 A | 3/1999 | Inaba ........................... 256/379 |
| 5,877,612 A | 3/1999 | Straw .......................... 330/254 |

(List continued on next page.)

FOREIGN PATENT DOCUMENTS

| | | |
|---|---|---|
| EP | 0322382 B1 | 9/1994 |
| EP | 0871223 a1 | 10/1998 |
| EP | 0611165 B1 | 7/1999 |

OTHER PUBLICATIONS

Edward K. F. Lee and P. G. Gulak, "Prototype Design of a Field Programmable Analog Array," Aug. 30, 1990, pp. 2.2.1–2.2.8.

Edward K. F. Lee and P. Glenn Gulak, "A CMOS Field–Programmable Analog Array," *Lee Journal Of Solid–State Circuits*, vol. 26, No. 12, Dec. 1991, pp. 1860–1867.

Lattice Semiconductor Corporation, "isPAC®10 Gain Stages And Attenuation Methods," Sep. 1999, pp. 1–5.

*Primary Examiner*—Tuan T. Lam

(57) ABSTRACT

The inventive level shifting circuit shifts an analog input signal by a precise amount. This allows it to be used in precision instrumentation applications where precise signal shifts are critical. It uses a self-biasing feedback circuit to determine the bias current needed to shift an analog signal by a desired amount. The circuit automatically compensates for influences by temperature, supply voltage, and process variations. This circuit also has value as a stand-alone function for other (non-programmable) products.

8 Claims, 6 Drawing Sheets

U.S. PATENT DOCUMENTS

| | | | |
|---|---|---|---|
| 5,912,567 A | 6/1999 | Drost et al. | 327/89 |
| 5,912,583 A | 6/1999 | Pierson et al. | 327/553 |
| 5,952,867 A | 9/1999 | Choi | 327/346 |
| 5,959,871 A | 9/1999 | Pierzchala et al. | 703/4 |
| 5,966,047 A | 10/1999 | Anderson et al. | 327/565 |
| 5,994,926 A | 11/1999 | Siniscalchi et al. | 327/65 |
| 6,014,097 A | 1/2000 | Brandt | 341/156 |
| 6,043,709 A | 3/2000 | Shin | 330/253 |
| 6,111,437 A | 8/2000 | Patel | 327/74 |
| 6,118,266 A | 9/2000 | Manohar et al. | 323/316 |
| 6,140,867 A | 10/2000 | de Micheli et al. | 327/553 |
| 6,201,429 B1 | 3/2001 | Rosenthal | 327/333 |

\* cited by examiner

PRECISION ANALOG LEVEL SHIFTER WITH PROGRAMMABLE OPTIONS

This application claims the benefit of U.S. Provisional Application No. 60/295,256, filed Jun. 1, 2001, entitled "Precision Analog Level Shifter With Programmable Options," and naming Hans W. Klein, Paul Hildebrandt, Joey Doemberg, and Jian Li as inventors. The above-referenced provisional application is hereby incorporated by reference herein in its entirety.

BACKGROUND

1. Technical Field

This invention relates to analog signal processing, and more particularly to an electronic level shifting circuit which shifts a source voltage signal by a fixed potential difference thereby producing a level shifted voltage signal. Specially, this invention relates to a level shifting circuit which is formed as an integrated circuit or a part thereof and which operates using current-controlled voltage offsetting circuitry.

2. Description of the Related Art

Programmable analog ICs (integrated circuits), such as the ispPAC10™ in-system programmable analog integrated circuit from Lattice Semiconductor Corporation, are well known in the art. The ispPAC10™ is described in publication an_6008_01 published by Lattice Semiconductor Corporation in September 1999. Typically, programmable analog ICs are implemented in MOS (metal oxide semiconductors), contain a plurality of instrumentation grade operational amplifiers and summing amplifiers and are fully differential from input to output, that is they are designed to handle differential signal inputs. Oftentimes such differential signals may have a common mode voltage approximating ground or one or other signal may be tied to ground. Since it is easier to accurately handle signals with an analog IC that are at least one nominal FET (metal oxide semiconductor field effect transistor) threshold voltage above ground (800 millivolts or so) then it becomes desirable to be able to apply a level shift to incoming signals. Such a shift might typically be 1.2 volts thus allowing analog signals to have a 2.8 volt swing and still remain a comfortable FET threshold voltage below a nominal 5 volt supply. For these and other reasons high performing level shifting circuits are provided in programmable analog ICs. Such level shifting circuits operate on signals to and/or from the amplifiers contained in the analog ICs.

FIG. 1 shows a prior art single ended level shifter using a constant current source 101 operating with a resistive load 102. A p-channel FET 103 (metal oxide semiconductor field effect transistor) operates in the saturation region as a source follower and is responsive to input voltage Vin. Assuming a high impedance load, since the output is a voltage, all of the current I (DC—direct current) generated by source 101 passes through resistance 102. Therefore, the output voltage (Vout) is the sum of the input signal voltage Vin plus the ohmic voltage drop across resistor 102 plus an offset due to the threshold voltage of the FET 103. To produce a desired voltage shift between Vin and Vout it is generally necessary to compensate for manufacturing variations in characteristics of the FET, the resistor, and the current source. Such compensation may typically be achieved by adjusting the value of I, the current generated by source 101, though other methods of adjustment may be possible.

FIG. 2 shows an analogous prior art level shifter that is essentially the n-channel equivalent or dual of the shifter shown in FIG. 1. In this case n-channel FET 203 operates as a source follower and is responsive to input voltage Vin. Constant current source 201 pulls current down through resistance 202 to offset voltage Vout from Vin. Analogous offset adjustment considerations apply as for the p-channel FET based shifter of FIG. 1.

The gate of a FET is sometimes referred to as the "control terminal" and the source and drain may be referred to as the "pair of current terminals". Level shifters of the types shown in FIGS. 1 and 2 may thus be generically described as having a constant current source, a resistive load connected thereto, a FET with one of its pair of current terminals connected to the resistive load and the other terminal connected to a fixed potential. The voltage input terminal of such a level shifter is connected to the control terminal of the FET and the shifted voltage output terminal connected to the resistive load and the current source.

In previously developed level shifters, precision components are often used to produce a compensated precision amount of level shift in an essentially open loop manner, that is, the parametric values of the precision components determine the amount of level shift produced.

When instrumentation baseband differential signals, as opposed to single ended signals, are involved and common mode level shifts are desired, it becomes even more important that voltage shifts be precise. An equal shift must be applied to each side of the differential signal conductor pair in order to avoid introducing offset errors into the signal. Thus, there is a need for a level shifting circuit, which is not only precise and stable but also highly reproducible within a subsystem.

Conventional level shifting circuitry cannot produce a level shifter that is as precise, stable and reproducible as the inventive level shifter without suffering other disadvantages such as excessive manufacturing cost.

SUMMARY OF THE INVENTION

Accordingly, a level shifting circuit that is precise, stable, reproducible and economic is presented. The shifting circuitry automatically calibrates out offset errors which may have unidentified origins.

The present invention provides for a level shifting circuit that includes multiple identical copies of a level shifter circuit, the multiple copies typically being created with identical geometry on a shared substrate. In an embodiment of the invention, one copy of the level shifter circuit (known as the reference level shifter) is used in a closed loop to determine the bias current needed to produce an offset voltage that matches a precision reference source. The bias current of the reference level shifter is reproduced in the other level shifters. Process and operational temperature, as well as other error source limited the performance of the previously developed devices. In the inventive devices, variations temporal and otherwise) are compensated for to the extent that they occur equally in all copies of the level shifter.

The level shifting circuitry disclosed includes a "constant" (i.e. high source impedance) current source (the bias current source), together with an open-loop level shifter. The bias current source provides operating current for the level shifter. The bias current source is implemented by a circuit that includes a further copy of an open-loop level shifter of the same design in an op-amp (operational amplifier) closed-loop control. This latter level open-loop shifter is the reference level shifter. Best performance results when the two copies of the open-loop level shifter comprised within the complete level shifting control circuit are of near identical characteristics.

In one embodiment, the closed-loop control operates as follows:- The op-amp receives a reference input voltage and produces an output voltage which is used to control a bias current. The bias current controls the reference open-loop level shifter that shifts a ground potential input by an offset voltage. The offset voltage is fed back to the op-amp to produce an operating point wherein the offset voltage is set to equal the reference voltage. A second, equal, bias current is created using the same op-amp output voltage and that second bias current is used to control a second open-loop shifter that receives an input signal and produces a desired output offset shifted signal. Other embodiments of closed loop control are possible within the general scope of the invention.

In a typical application, additional circuitry is added for reproducibility, consistency and performance improvements as well as for robustness and power up power down sequencing to avoid metastability, degradation and/or damage. Careful attention is paid to layout to ensure best performance. Moreover, in a practical circuit additional level shifters will be present to provide additional "channels" (corresponding pairs of inputs and outputs). Thus, a relatively simple multiple channel device would typically be provided with only one bias current source but multiple channels that all operate with the same input to output offset. That the channels are very well matched, in a practical device, is desirable so that a voltage offset may be applied to each leg of a differential signal with only an acceptable level of differential error being introduced.

In one embodiment of this invention, an entire multiple-channel level shifting control circuit is formed on part of a single semiconductor substrate using CMOS (complementary metal-oxide semiconductor) techniques.

The foregoing is a summary and this contains, by necessity, simplifications, generalizations and omissions of detail; consequently, those skilled in the art will appreciate that the summary is illustrative only and is not intended to be in any way limiting. As will also be apparent to one of skill in the art, the operations disclosed herein may be implemented in a number of ways, and such changes and modifications may be made without departing from this invention and its broader aspects. Other aspects, inventive features, and advantages of the present invention, as defined solely by the claims, will become apparent in the non-limiting detailed description set forth below.

DETAILED DESCRIPTION

The following sets forth a detailed description of the best contemplated mode for carrying out the invention. The description is intended to be illustrative of the invention and should not be taken to be limiting.

The disclosed level shifting circuit shifts an analog input signal by a precise mount. This allows the level shifting circuit to be used in precision instrumentation applications where precise signal shifts are critical. The level shifting circuit uses a self-biasing feedback circuit to determine the bias current needed to shift an analog signal by the desired amount (e.g., 1.2V ). The circuit automatically compensates for influences by temperature, supply voltage, and process variations. It also features a "self-cascoding" output device for greater linearity. This level shifting circuit can be implemented as a separate integrated circuit, or included in an integrated circuit having additional functionality.

Figure 1:
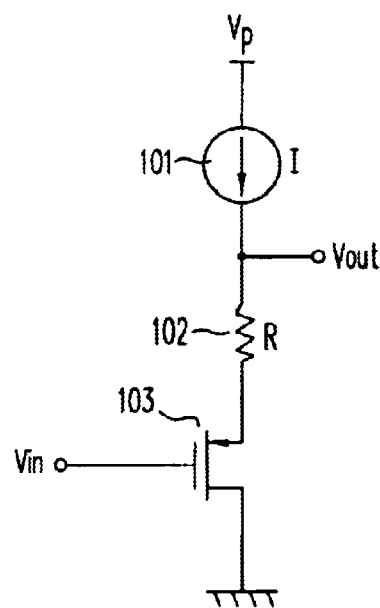
FIG. 1 is a circuit diagram of a simple prior art p-channel FET based source follower with level shifter.
Figure 2:
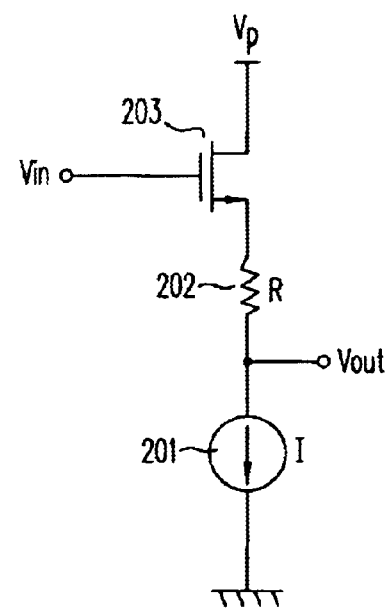
FIG. 2 is a circuit diagram of a simple prior art n-channel FET based source follower with level shifter.
Figure 3:
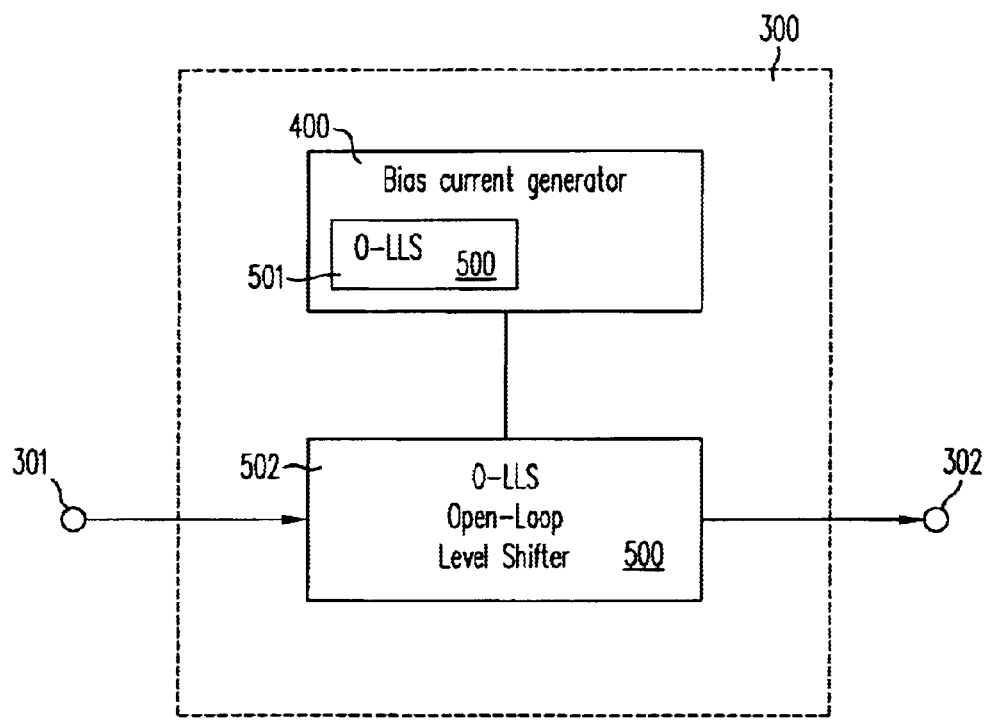
FIG. 3 is a circuit block diagram of a complete level shifting circuit according to an embodiment of this invention.

Referring to FIG. 3, a block diagram of an inventive level shifting circuit is shown. Level shifting circuit 300 comprises an instance 502 of an open-loop level shifter 500 and a bias current generator 400, which, in turn, contains a further instance 501 of an open-loop level shifter 500. The use of two open-loop level shifters is intended to be exemplary and is not critical to the invention. Rather the term open-loop level shifter is intended to contrast with the complete level shifting circuit which, as will be seen, operates in a closed-loop mode. Two closed loop level shifters could be used in place of the two open-loop level shifters within the general scope of the invention.

Still referring to FIG. 3, the two instances 501 and 502 of open-loop level shifter 500 are essentially the same, sharing process technology, circuit topology, circuit parameters and geometry. Each instance 501, 502 of open-loop level shifter 500 is a level shifting circuit but in contrast with the macro level shifting circuit 300, level shifters 500 do not necessarily include closed loop feedback control. Terminals 301 and 302 are provided for an input voltage and a level shifted output voltage respectively.

Figure 4:
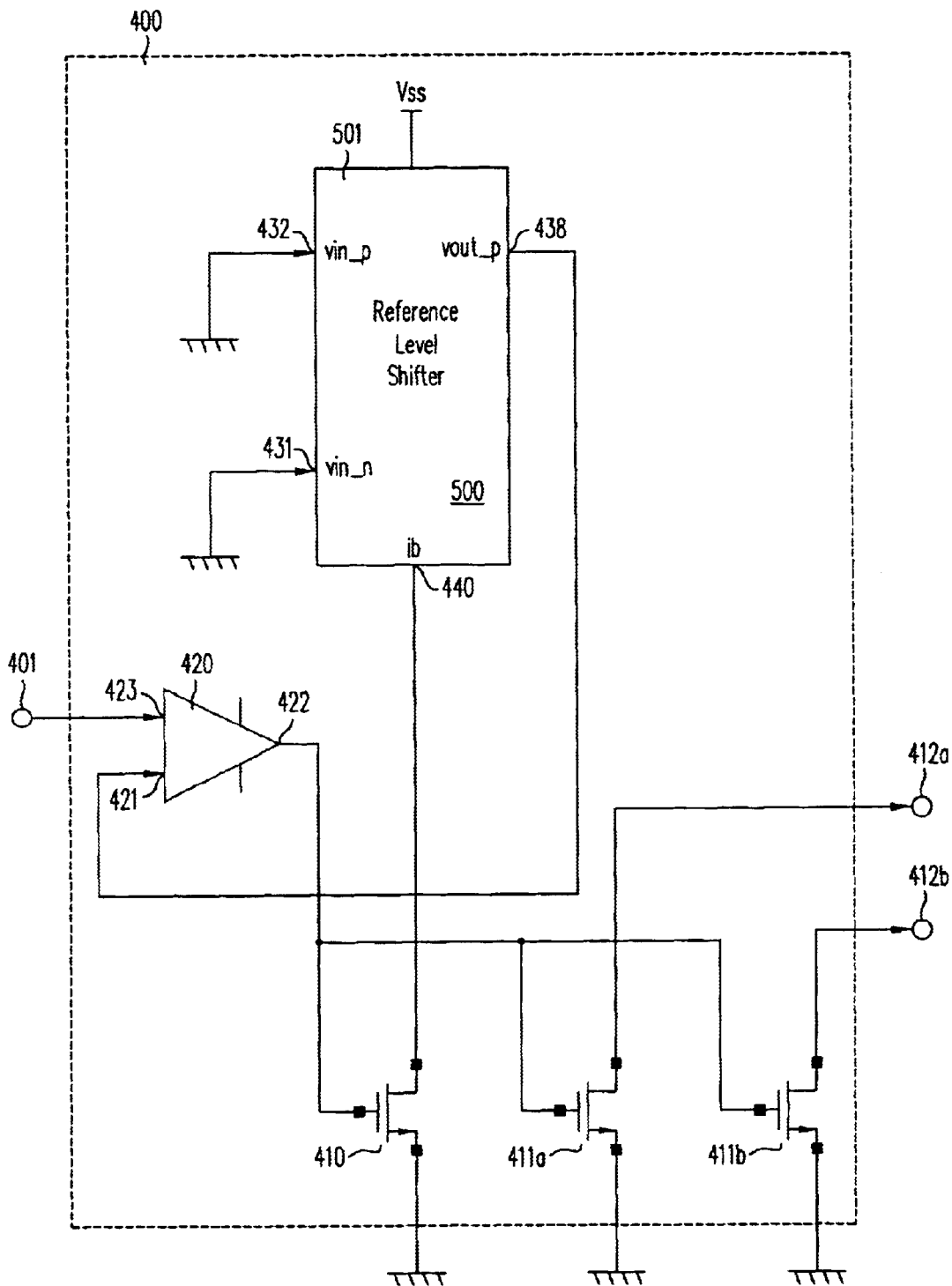
FIG. 4 is a circuit block diagram of level shifter bias current generator according to an embodiment of this invention.

Referring to FIG. 4, this shows a block diagram of a bias current generator 400 suitable for use in embodying the present invention. Comprised within the bias current generator 400 is an instance 501 of an open-loop level shifter 500. This particular instance 501 of open-loop level shifter 500 is referred to as the reference level shifter 501. Positive input terminal 432 of reference shifter 501 is tied to ground, since the reference level shifter is used to calibrate voltage shifted from ground potential for given bias current in a quiescent signal condition. Some embodiments of open-loop level shifter 500 may provide for differential inputs as shown in FIG. 4, in which case conventionally negative input terminal 431 is tied to ground potential. Regardless of whether open-loop level shifter 500 is embodied as a differential or single-ended circuit, signal input(s) of the reference shifter 501 are tied to ground potential.

Still referring to FIG. 4, bias current generator 400 includes an op-amp 420 (operational amplifier) which is operated as a closed loop control. The output 438 of the reference shifter 501 is supplied to the inverting input 421 of the op-amp 420. The input terminal 401 of the bias current generator 400 is tied to a precision reference voltage (not shown) which is the reference that defines the potential difference by which the level shifting circuitry 300 is to shift the input signal. Non-inverting input 423 of op-amp 420 is connected to input terminal 401.

Still referring to FIG. 4, the operation of closed loop control proceeds as follows:

Rising voltage on op-amp output 422 causes FET 410 to draw down increasing bias current (in the order of 10 microamperes) from bias current input port 440 of reference shifter 501. This causes output voltage at output terminal 438 of reference shifter 501 to rise, which in turn causes inverting input 421 of op-amp 420 to rise until inverting input 421 of op-amp 420 reaches non-inverting input 423 of op-amp 420, whereupon a steady state is reached. In the steady state output voltage 438 of reference shifter 501 is equal to reference voltage at input terminal 401 of the bias current generator 400, regardless of variations in temperature or other factors affecting the circuit. This is the desired operating condition of the bias current generator.

Still referring to FIG. 4, in the desired operating condition, output voltage terminal 422 of op-amp 420 feeds not only FET 410 but also a number of substantially identical FETs. Two-such FETs are shown in FIG. 4 as 411a and 411b, though the number is somewhat arbitrary. These FETs have corresponding output current bias terminals 412a and 412b and are intended for driving instance(s) 502 of open-loop level shifters 500 having closely matched performance to that of the reference shifter instance, 501 of open-loop level shifter 500. Generally all instances of open-loop level shifter 500 will have as closely matched performance as economy and fabrication process variables etc. permit. Thus the bias circuit uses one copy of open-loop level shifter 500 to generate bias offset output current which is used to drive additional copies of open-loop level shifter 500. Accurate and precise functioning of the level shifting circuitry 300 is dependent upon consistent performance of level shifters 500 and upon performance of voltage reference source (not shown but connected to terminal 401).

Figure 5:
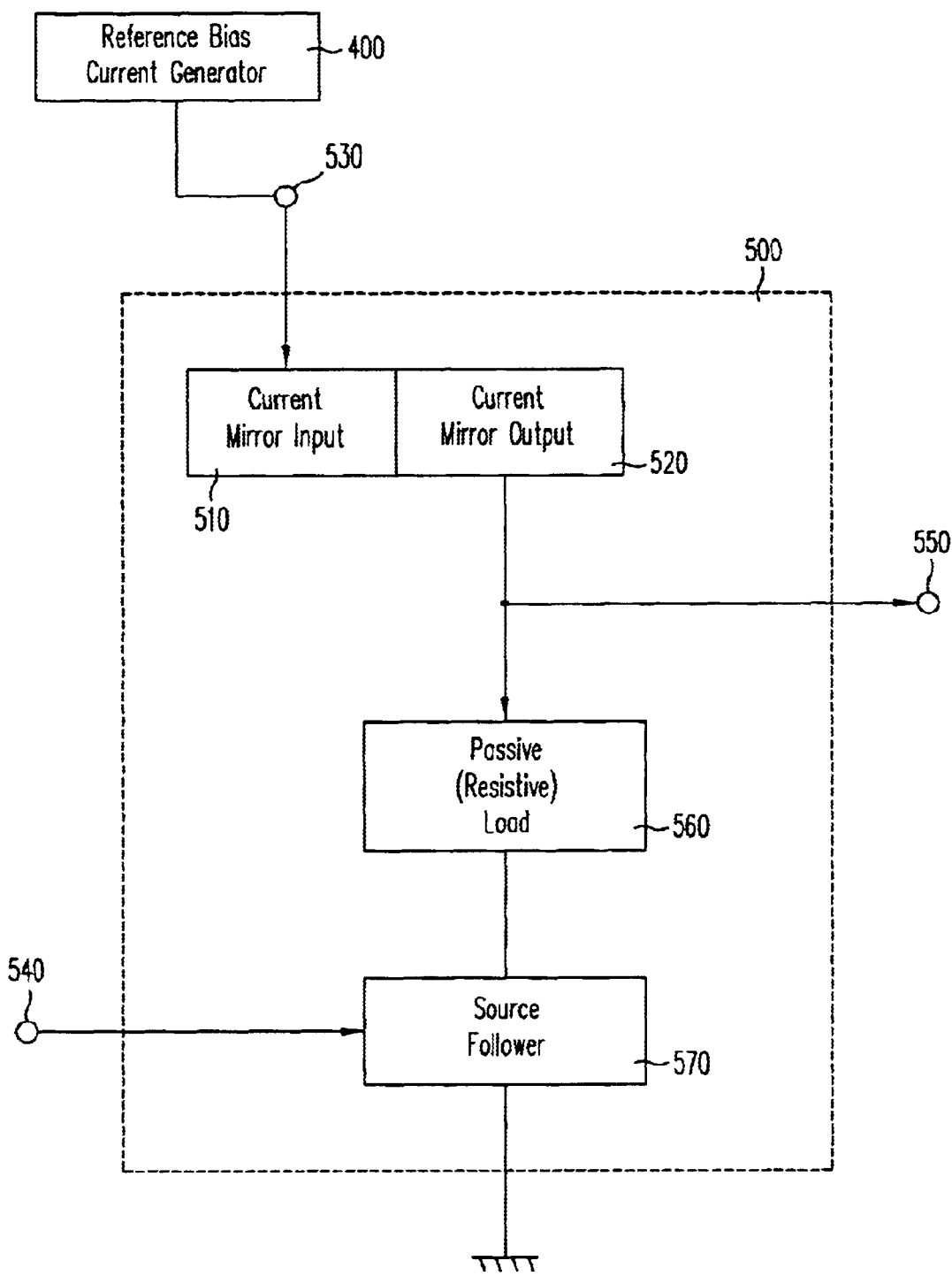
FIG. 5 is a block diagram of a level shifter according to an embodiment of this invention.

FIG. 5 shows a block diagram of an open-loop level shifter 500 suitable for use in embodying the present invention. Level shifter 500 has an input bias current terminal 530, an input source voltage (signal) terminal 540, and an output terminal 550 for the level shifted voltage. The reference bias current generator 400, described supra, provides current to the level shifter 500 via terminal 530. The bias current is reflected in a current mirror having input 510 and output 520 sides. Current mirrors are well known in the art, such as the well-known cascode current mirror or the Wilson current mirror as may be implemented using FETs. The current output from the current mirror passes through a precise, though not necessarily accurate resistive load 560, generating an offset voltage. Resistive loads constructed on semiconductor substrates are also well known in the art. A source follower 570 ensures that the output terminal for the level shifted voltage 550 is a sum of the input signal voltage appearing at the input source voltage terminal 540 plus offsets. Offsets referred to are effects of the current through the resistive load 560 and due to other effects such as threshold voltages of FET(s) used to embody source follower 570.

It will be apparent to one of ordinary skill in the art that source follower 570 is well implemented using one or more p-channel FETs, since the source follower is connected directly to ground potential. It will also be apparent to one of ordinary skill in the art that n-channel FET(s) could be used to create a similar circuit (often termed a dual) with the source follower transistor coupled to the positive supply rail. Although enabling disclosure is made to the use of p-channel FET(s) in specific circuits, substantial equivalents, including duals, should be considered as within the general scope of the invention.

Figure 6:
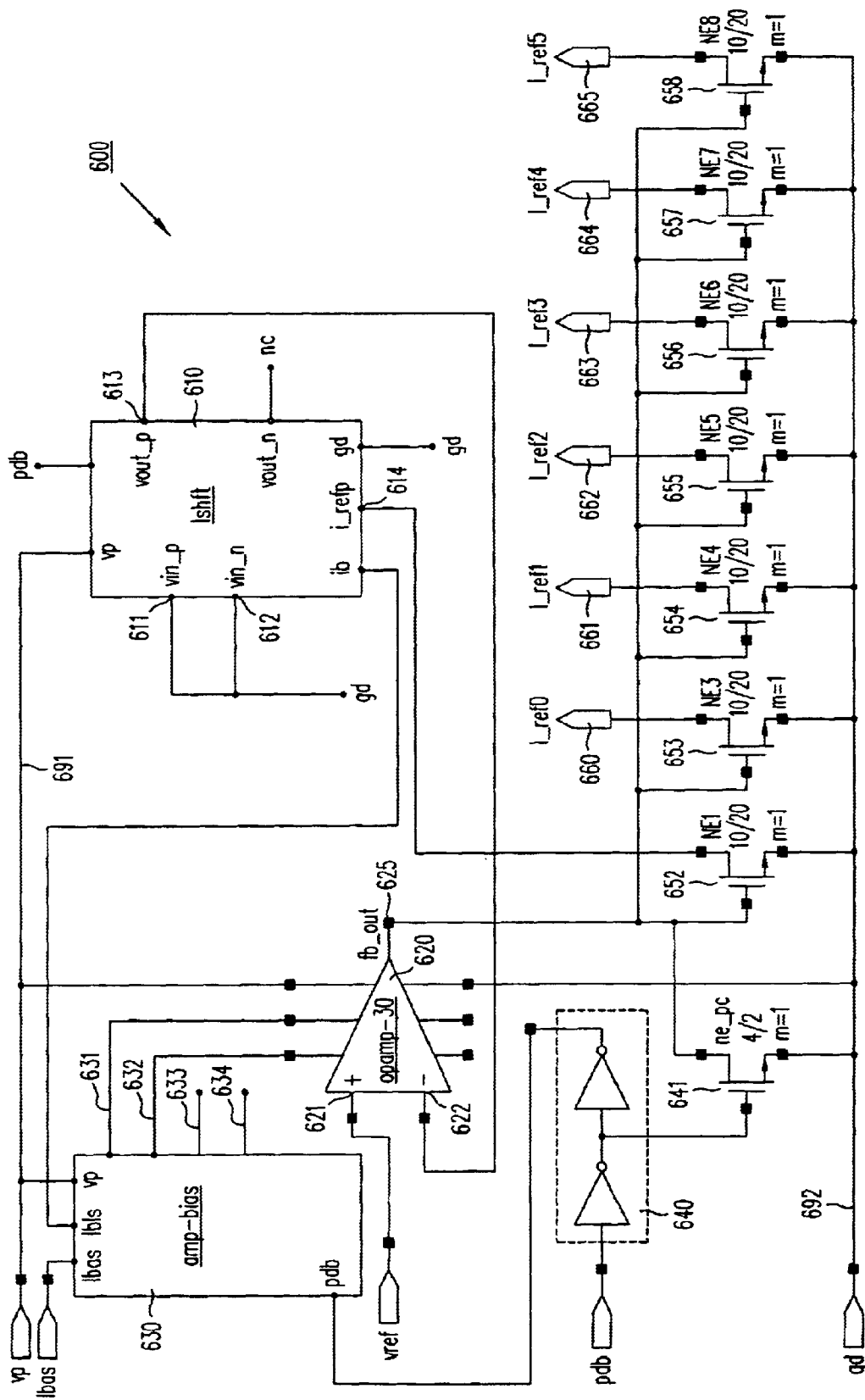
FIG. 6 is a detailed circuit diagram of a level shifter bias current generator according to an embodiment of this invention.
Figure 7A:
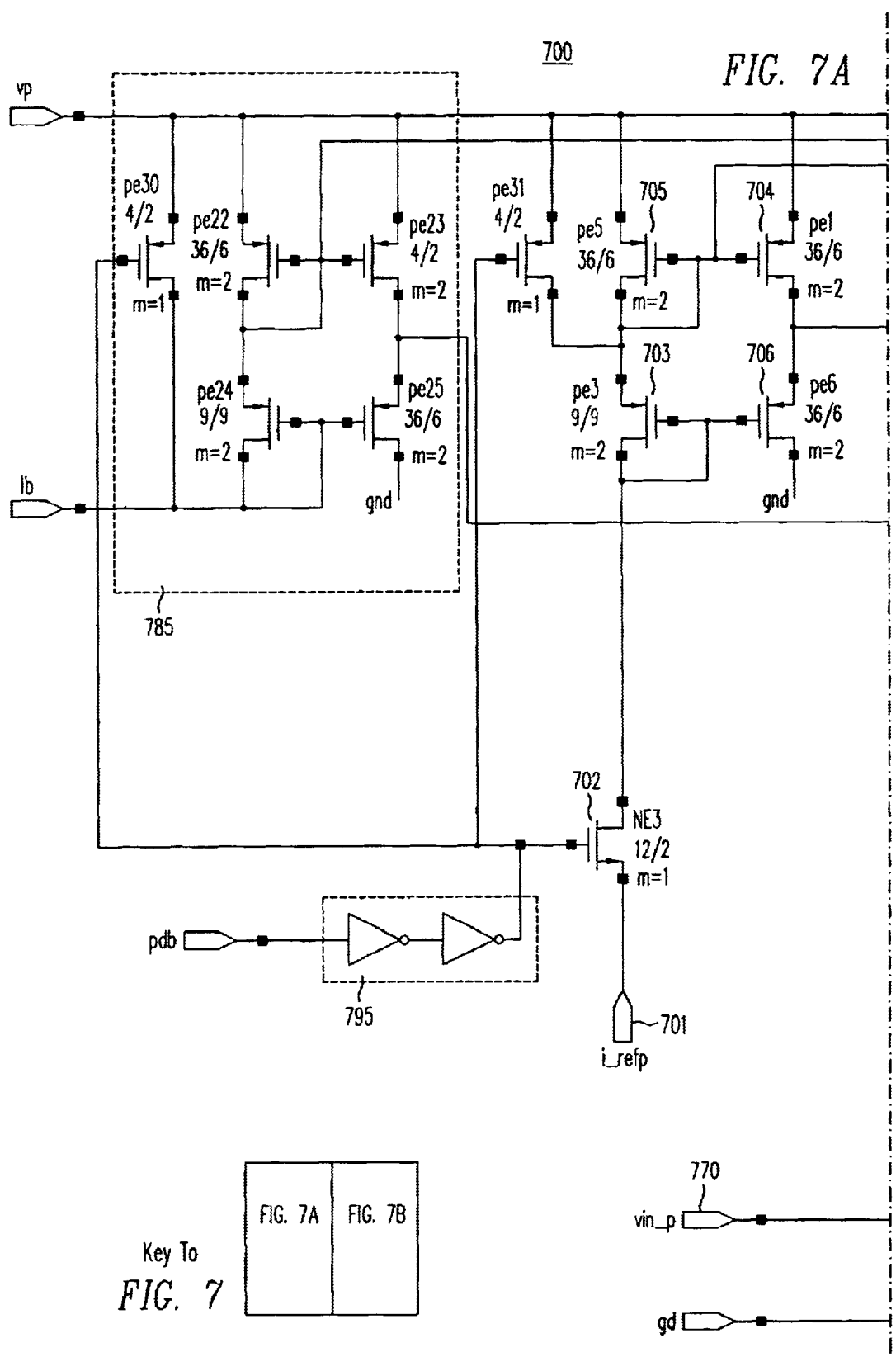
FIG. 7 is a detailed circuit diagram of a level shifter according to an embodiment of this invention.
Figure 7B:
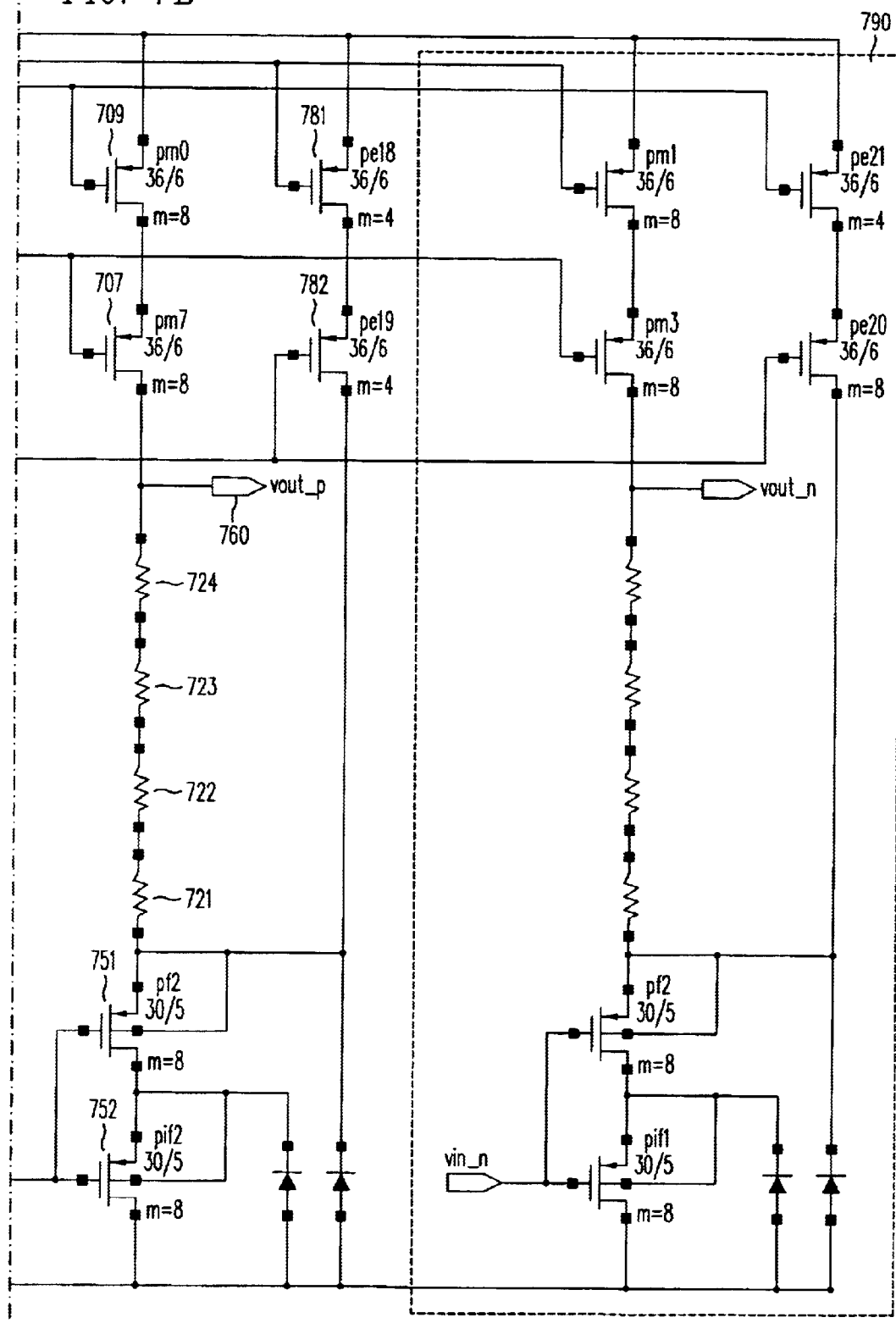

FIG. 6 shows a practical circuit for an embodiment of the bias current reference generator 600 and includes several refinements for good operation in a real embodiment in a MOS (metal-oxide semiconductor) chip subsystem. The practical bias current reference generator is implemented in MOS. As described at the block diagram level, supra, operation is based upon a negative feedback loop using an instance 610 of level shifter 700 (FIG. 7). The two differential inputs vin_p 611 and vin_n 612 of shifter 610are tied together and to ground thus giving null inputs. The output vout_p 613 of shifter 610 is fed back to the negative (inverting) input 622 of operational amplifier opamp-30 620. Opamp-30 620 makes a comparison between the voltage at the negative input 622 and the external shift voltage reference vref which is presented at the positive input 621. Level shifter 610 and opamp-30 620 are connected to conventional DC power rail vp 691 and ground gd 692.

Still referring to FIG. 6, a bias voltage generating circuit "ampbias" 630 generates four bias voltages 631, 632, 633 and 634 for opamp-30 620. The subsystems ampbias 630 and level shifter instance 610 each can beplaced in a standby mode by action of the power down control circuit 640. The power down control circuit 640 also uses FET ne_pd 641 to clamp output fbout 625 of opamp-30 620 under apower down condition. Otherwise, fb_out 625 feeds the gates of seven FETs NEI 652 and NE3 through NE8 (653 through 658). The seven FETs NE1 652 and NE3 through NE8 (653 through 658) are all of the same type and have the same geometry and "m-numbers" and so should perform substantially the same as each other. NE1 652 sinks current at the i_refp input 613 of shifter instance 610. The opamp-30 620 output fb_out 625 drives NE1 652 to the operating point at which the potential at the output vout_p of shifter instance 610 is equal to the external shift voltage reference vref connected at opamp-30 input 621. In the specific implementation, disclosed vref is 1.2 volts and a shift of 1.2 volts is accomplished. However the 1.2 volt value of vref is not critical and is intended to be exemplary rather than limiting.

Still referring to FIG. 6, transistors NE3 through NE8 653–658 all have the same gate source voltage as NE1 652 and consequently the same current at nodes i_ref0 i_ref5 650–655 will be drawn through these nodes. The nodes 650–655 are each connected to instances (not shown) of level shifter 700 (FIG. 7).

Still referring to FIG. 6, in summary, bias current reference generator 600 takes a reference voltage vref at input 621 and bias current reference generator 600 outputs six current sinks 660–665 that cause instances of shifter 700 to each apply an offset voltage equal to vref.

FIG. 7 shows a schematic of a practical embodiment of a level shifter 700. shifter 700 receives an input current i_refp 701 from the bias current generator described supra in connection with FIG. 6. The current passes through an n-channel FET NE3 702 which serves as a power down disconnect. The current also passes through a conventional p-channel cascode current mirror formed by p-channel FETs pe3 703, pe5 705, pe6 706, pe1 704, pm7 707 and pm0 709. It may be noted from the schematic FIG. 7 that FETs pe5 705 and pm0 709 have the same W/L parameters but their "m-numbers" are in the ratio of 4:1. Consequently, the current in the output section of the current mirror (source-drain of pm0 709) is four times that of the input current i_refp. This current amplification is chosen to provide a compromise giving sufficient current for noise immunity in routing the bias currents without excessively increasing overall current consumption. The compromise also permits a sufficiently robust current for noise immunity and to allow resistive load 721–724 to be a small enough ohmic value for ease of fabrication to a precision, or at least highly repeatable value. As is customary W/L refers to width/length dimensions for FET gate (36 microns 16 microns for pe5

705 and pm0 709). As is also customary, "m-number" refers to the number of FETs connected in parallel. The schematic FIG. 7 shows pe5 705 has an m-number of 2 whereas pm0 709 has an m-number of eight giving rise to the 4:1 current ratio mentioned above. FETs are connected in parallel in order to maximize the accuracy of implementing the desired current ratio of 4:1 in this case.

Still referring to FIG. 7, the current mirror output current (that is controlled primarily by FET pm0 709 and its cascode pm7 707) passes through resistive load 721 724. The resistive load 721–724 is constructed as four series stages for repeatability. Small variations of resistance due to process considerations are cancelled out provided they are repeated precisely in all instances of level shifter 700 on a single chip.

Still referring to FIG. 7, the current passes through a source follower formed by p-channel FET pf2 751 and its cascode device pif2 752. Voltage at node vout_p 760 is the sum of the input voltage vin_p (at node 770) plus offsets due to the resistive load 721–724 plus offset due to the threshold of the source follower FET 751, and possibly other sources. In an interesting arrangement, gates of FETs 751, 752 are tied together; this is operable because pif2 752 is a low threshold voltage type so that a constant 1.1 volt total appears across source follower transistor 751, thereby greatly increasing the linearity of the level shifter across its full signal range. This works out well in practice since this practical circuit is typically used to generate a 1.2 volt offset. However this use of a low voltage transistor in a source follower cascode pair is not an essential feature of the invention but is merely an implementation example of well-known circuit considerations that go into embodying the invention.

Still referring to FIG. 7, it should be appreciated that since the current through the resistances may need to generate a potential difference of in the hundred(s) of millivolts, the bandwidth of the shifter could become limited. Such an effect would be due to the time constant effect of the resistive 721–724 load working against the capacitance of FETs 751, 752. In order to overcome excessive bandwidth limitation, an effectively high source impedance current source is formed by FET pair pe18 781 and pe19 782 to improve slew rate. This current source is mirrored by a mirror circuit 785 from a supplied bias current ib using FETs pe30, pe22, pe23, pe24, pe25 working into pe18 781 and cascode pe19 782. This bypass current does not upset the accuracy of the level shifter since a fixed relationship between currents exists in all copies of the shifter including the reference shifter 610 (FIG. 6).

Still referring to FIG. 7, it should be appreciated that the action of the shifter in translating vin_p at node 770 to an offset vout_p at node 760 is for half (by convention the positive half) of a pair of differential signals. An entire duplicate shift arm of circuitry 790 exists for the negative signals vin_n to vout_n. That vin_p and vin_n are offset by a voltage which is set in both cases by current i_refp reflects the need for both signals to be offset by a near identical amount in order to avoid introducing error into the differential signal.

The shifting circuitry 700 also includes components 795 for power down control.

Without intending to limit the scope of the invention, it is envisioned that one valuable use for the described embodiments of the level shifting circuit will include integration into chips that include differential instrumentation amplifiers. In particular, by shifting differential signals by +1.2 volts away from ground it becomes permissible for one side of an input voltage signal to be grounded giving, in effect, a single ended signal. Working with signals that are, at lowest, 1.2 volts away from ground is easier allowing such signals to be operated on in subsequent circuitry in a more effective and/or accurate manner.

Matching of the multiple instances of shifters 700 and of bias current FETs 652–658 is crucial to the performance of the level shifting circuitry. Although it is simplest to use components with equal parameters, it would be possible, within the general scope of the invention to use components having a precise ratio (other than 1:1) between parameters. Physical placement of the components on the chip is important as is maintaining good control of the process to assure accurate geometry and to minimize such things as gradients in oxide thicknesses, implant concentrations and temperature. For example, the reference shifter would typically be placed in the center of a die with six slave shifters arranged as three on either side. Similarly, though it is commonplace in other circuits, it would be undesirable here to mirror parts of the mask. Mirroring may be useful in certain chips to provide symmetry of characteristic but here it is more important that any process gradients run the same way on each copy of the circuit. Though these considerations and many others are important to realize a high performance product, they are not essential features of the invention.

Within the general scope of the invention, other embodiments will be apparent to a person of ordinary skill in the relevant arts. For example p-channel devices may be substituted for n-channel devices or vice versa with appropriate inversion of circuit topology. CMOS (complementary metal-oxide semiconductor) implementations are also well within the reach of one of ordinary skill in the relevant arts. Another example within the general scope of the invention might involve the use bipolar transistors or integrated circuit operational amplifiers or other switches rather than,FETs. The invention should be regarded not as limited by the embodiments disclosed but only by the claims herein.

What is claimed is:

1. A level shifting circuit comprising:

a reference level shifter having a set of performance characteristics, the reference level shifter for applying offset voltage to an input signal in response to input bias current;

a second level shifter having performance characteristics closely matched to the set of performance characteristics of the reference level shifter;

a first bias current control for supplying bias current to the reference level shifter, the first bias current control responsive to control voltage;

a second bias current control for supplying bias current to the second level shifter, the second bias current control responsive to the control voltage; and an operational amplifier receiving a reference voltage and arranged in a closed-loop control with the first bias current control and the reference level shifter, the operational amplifier providing the control voltage to the first bias current control and to the second bias current control; whereby the second level shifter offsets a second signal by a second offset voltage in proportion to the reference voltage.

2. A level shifting circuit for shifting a source voltage supplied with a source terminal to supply a level shifted voltage to a level shifted voltage supplying terminal, by a shift reference voltage provided at a shift reference voltage terminal, the level shifting circuit comprising:

a first and a second level shifter each comprising:
an input bias current terminal;
a current mirror connected to the input bias current terminal;
a resistive load receiving current from the current mirror;
a transistor having a control terminal conducting current from the resistive load;
an input voltage terminal connected to the control terminal of the transistor; and
an output voltage terminal connected to the resistive load producing an output voltage responsive to current at the input bias current terminal and further responsive to voltage at the input voltage terminal;
an operational amplifier having
a first input terminal connected to the shift reference voltage terminal;
a second input terminal connected to the output voltage terminal of the first level shifter; and
an output terminal;
a first and a second bias generating transistor each having
a control terminal connected to the output terminal of the operational amplifier; and
a pair of current terminals;
wherein current terminals selected from the pairs of current terminals of the first and the second bias generating transistors supply bias current to the input bias current terminals of the first and the second level shifters;
and wherein the operational amplifier, the first level shifter and the first bias generating transistor comprise a negative feedback closed loop control;
and wherein current at the input bias current terminal of the second level shifter is in proportion to current at the input bias current terminal of the first level shifter;
and wherein the source terminal and the level shifted voltage supplying terminal are connected to the second level shifter; whereby the level shifted voltage is responsive to the source voltage and the shift reference voltage.

3. The level shifting circuit of claim 2 being formed within a semiconductor substrate.

4. The level shifting circuit of claim 2 being formed as an MOS integrated circuit.

5. A method for shifting a signal voltage, the method comprising:
providing a first shifter having a grounded signal input, a first bias current input and a first signal voltage output;
providing a second shifter having a signal input receiving the signal voltage, the second shifter having a second bias current input and a second signal voltage output;
providing an operational amplifier;
operating the operational amplifier in a closed loop control circuit with the first shifter; and
operating the second shifter so that the second bias input current is equal to the first bias input current.

6. A programmable analog integrated circuit comprising:
an analog amplifier having inputs and outputs;
and a level shifting circuit for shifting the inputs of the analog circuit,
the level shifting circuit comprising:
a first and a second level shifter each comprising:
an input bias current terminal;
a current mirror connected to the input bias current terminal;
a resistive load receiving current from the current mirror;
a transistor having a control terminal conducting current from the resistive load;
an input voltage terminal connected to the control terminal of the transistor; and
an output voltage terminal connected to the resistive load producing an output voltage responsive to current at the input bias current terminal and further responsive to voltage at the input voltage terminal;
an operational amplifier having:
a first input terminal connected to a shift reference voltage terminal;
a second input terminal connected to the output voltage terminal of the first level shifter; and
an output terminal;
a first and a second bias generating transistor each having:
a control terminal connected to the output terminal of the operational amplifier; and
a pair of current terminals;
wherein current terminals selected from the pairs of current terminals of the first and the second bias generating transistors supply bias current to the input bias current terminals of the first and the second level shifters;
and wherein the operational amplifier, the first level shifter and the first bias generating transistor comprise a negative feedback closed loop control;
and wherein current at the input bias current terminal of the second level shifter is in proportion to current at the input bias current terminal of the first level shifter;
and wherein a source terminal and a level shifted voltage supplying terminal are connected to the second level shifter.

7. The integrated circuit of claim 6 being formed within a semiconductor substrate.

8. The integrated circuit of claim 6 being formed as an MOS integrated circuit.

* * * * *